United States Patent [19]

Tanita et al.

[11] Patent Number: 5,203,661
[45] Date of Patent: Apr. 20, 1993

[54] HANDLING DEVICE FOR ARTICLES OR CONTAINERS

[75] Inventors: Takeo Tanita; Masateru Yasuhara; Shozo Kasai, all of Kawasaki; Yusaku Azuma; Toshihiro Yamamoto, both of Yokohama; Norio Nikaido, Tsuchiura; Toshio Tsuda, Yokohama, all of Japan

[73] Assignee: Canon Kabushiki Kaisha, Tokyo, Japan

[21] Appl. No.: 598,746

[22] Filed: Oct. 16, 1990

Related U.S. Application Data

[63] Continuation of Ser. No. 225,175, Jul. 28, 1988, abandoned.

[30] Foreign Application Priority Data

| Aug. 5, 1987 | [JP] | Japan | 62-119245[U] |
| Aug. 5, 1987 | [JP] | Japan | 62-119246[U] |
| Jan. 30, 1988 | [JP] | Japan | 63-20799 |

[51] Int. Cl.$^5$ .............................................. B65G 1/02
[52] U.S. Cl. ................................... 414/331; 414/280; 414/751; 414/753
[58] Field of Search .............. 414/280, 331, 661, 751, 414/753

[56] References Cited

U.S. PATENT DOCUMENTS

| 4,394,104 | 7/1983 | Camerini et al. | 414/280 X |
| 4,614,474 | 9/1986 | Sudo | 414/331 X |
| 4,651,863 | 3/1987 | Reuter et al. | 198/339.1 |
| 4,690,602 | 9/1987 | Castaldi et al. | 414/751 X |
| 4,818,169 | 4/1989 | Schram et al. | 414/331 |

FOREIGN PATENT DOCUMENTS

| 49-8752 | 2/1974 | Japan . |
| 54-001750 | 1/1979 | Japan . |
| 54-001751 | 1/1979 | Japan . |
| 57-034161 | 7/1982 | Japan . |
| 57-034162 | 7/1982 | Japan . |
| 60-087122 | 5/1985 | Japan . |
| 61-146429 | 7/1986 | Japan . |
| 61-168452 | 7/1986 | Japan . |
| 61-206708 | 9/1986 | Japan . |

Primary Examiner—Michael S. Huppert
Assistant Examiner—Janice Krizek
Attorney, Agent, or Firm—Fitzpatrick, Cella, Harper & Scinto

[57] ABSTRACT

A handling device for a stocker, for storing various articles or containers, has a pair of engaging members for storing or extracting the articles, in which the engaging members have unbalanced engaging forces and the articles are aligned in one direction by the unbalanced engaging forces.

7 Claims, 10 Drawing Sheets

HANDLING DEVICE FOR ARTICLES OR CONTAINERS

This application is a continuation of application Ser. No. 225,175 filed Jul. 28, 1988, now abandoned.

BACKGROUND OF THE INVENTION

1. Field of the Invention

The present invention relates to a handling device of a stocker, such as automatic warehouse or automatic part feeder, for temporary storage of articles, units, products etc. and supply thereof to a working or assembling station.

2. Related Background Art

An assembling apparatus is disclosed for example in U.S. Pat. No. 4,651,863, corresponding to Japanese Laid-open Patent Application No. 60-56702.

Also an article feeding apparatus is disclosed for example in the U.S. patent application Ser. Nos. 887,130 which is now U.S. Pat. No. 4,844,680, and 903,412, abandoned and refiled as Ser. No. 306,260, which is now U.S. Pat. No. 4,932,828, of the present applicant.

In these apparatus, for supplying parts, semi-assembled units or the like to an automatic assembling machine such as a robot, these articles are stored in a stocker and then taken out therefrom according to the demand of the assembling machine. The stocker is equipped with shelves on which are stored containers, called pallets or trays, for containing the articles. Various handling devices are available for storing said containers into the shelves or extracting the same from the shelves.

As an example of the handling device, Japanese Utility Model Publication Nos. 54-1750 and 54-1751 disclose an apparatus having storing shelves arranged in a matrix and a container carrier movable in vertical and horizontal directions in front of said shelves for automatic storage and extraction of the containers into and from the shelves. The apparatus comprises a container holding member provided on said container carrier movably between the ends thereof in a direction to and away from said shelves and having a smaller dimension in said moving direction. The apparatus includes a pair of container guide members provided on said container carrier, on both sides of said container holding member, wherein said container holding member is provided with a housing of a height lower than the upper face of said container guide members and an engaging member mounted at the rear end of said housing in the movable direction thereof for engagement with the container. The engaging member is movable between a higher position and a lower position with respect to the upper face of said container guide members.

Also, Japanese Laid-open Patent Application No 61-206708 discloses a tray distributing apparatus comprising a tray storage unit, a transporter for storage or extraction of trays, and an elevator member, wherein said transporter comprises a hook member for supporting the tray and a chain for horizontally moving said hook member.

SUMMARY OF THE INVENTION

In the apparatus disclosed in the above-mentioned patent applications of the present applicant, the handling device transports a pallet by engaging a hook of the pallet moving device with a claw formed in a flange of the pallet.

In such structure, however, the width of the inserting portion formed by the pallet itself and the claw thereof has to be made larger than the width of the hook in order to facilitate the insertion thereof. Thus the play inevitably present between the hook and the claw hinders smooth movement at the start of operation, and the hook may be disengaged from the claw due to the vibration of the pallet or hook if the pallet is moved at a high speed beyond a certain limit.

A first object of the present invention, therefore, is to provide a handling device capable of securely holding and transporting the container for the articles.

In the container extraction means disclosed in the aforementioned Japanese Utility Model Publication Nos. 54-1750 and 54-1751, in which the container is extracted by engaging a claw with an engaging plate of the container, the extracted position of the container may be deviated in the course of movement, whereby the robot may become unable to properly grasp the article in the container. Particularly if the container contains many articles, if the articles are small or if the robot hand has a limitation in the grasping position, the grasping position of the articles must be determined with high precision.

A second object of the present invention is to provide a device capable of realizing a precise position of the storage or extraction of the articles or containers, in order to resolve the above-mentioned inconvenience.

Also as explained above, the assembly of precision parts requires precise grouping of the articles by the robot hand, and gentle transportation of the container without vibration.

A third object of the present invention, therefore, is to provide a handling device capable of automatic engagement and disengagement between the article or container and the engaging members of the handling device according to the extracting operation of the container, thereby dispensing with operating means for the engaging members.

BRIEF DESCRIPTION OF THE DRAWINGS

FIGS. 1 and 2 illustrate a feeding apparatus embodying the present invention, wherein:

FIGS. 5 to 9 illustrate a first embodiment of the present invention, wherein:

FIGS. 10 and 11 illustrate a second embodiment of the present invention, wherein:

DETAILED DESCRIPTION OF THE PREFERRED EMBODIMENTS

Now the present invention will be clarified in detail by embodiments thereof shown in the attached drawings.

Figure 1:
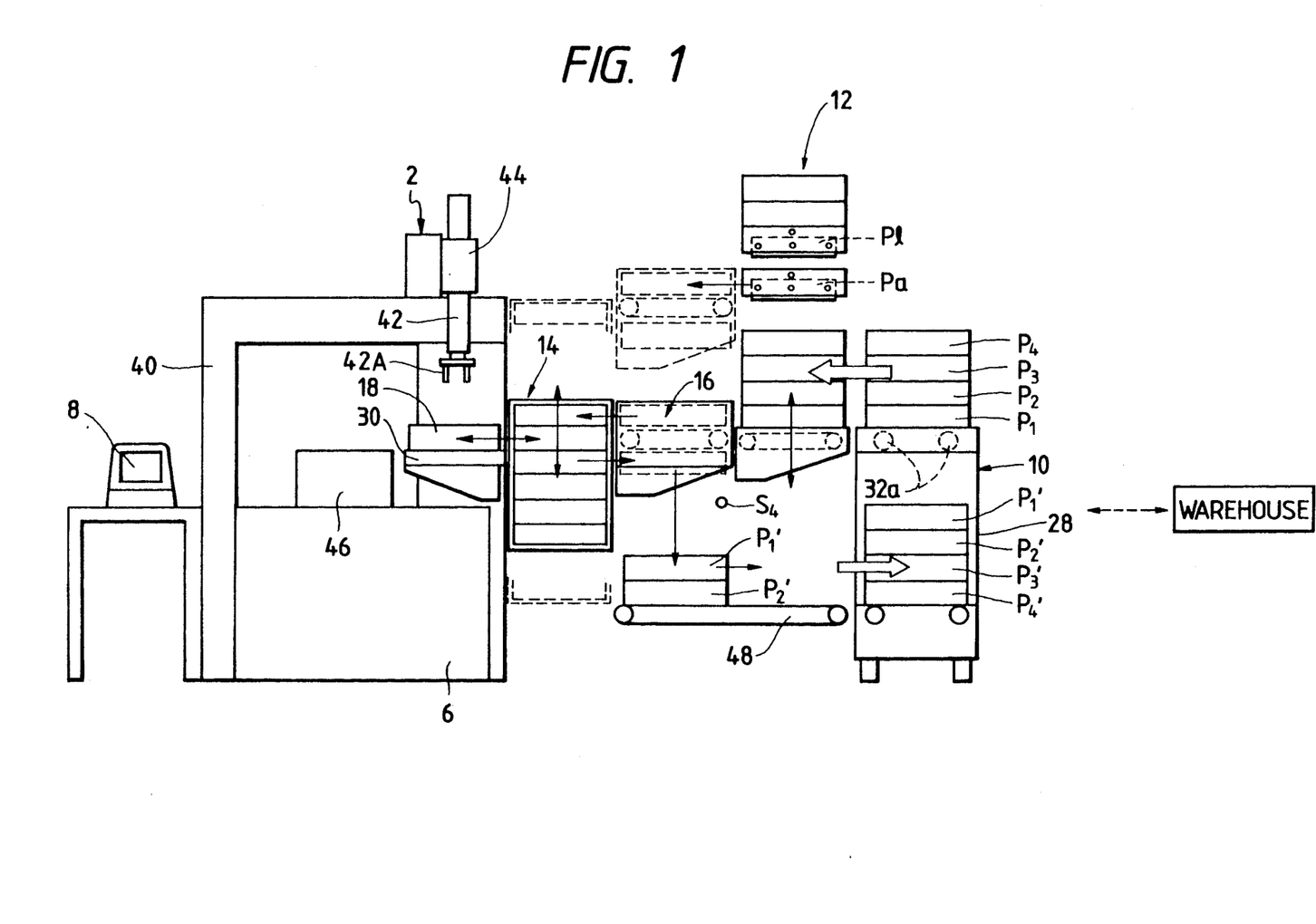
FIG. 1 is a schematic view of the entire apparatus.
Figure 2:
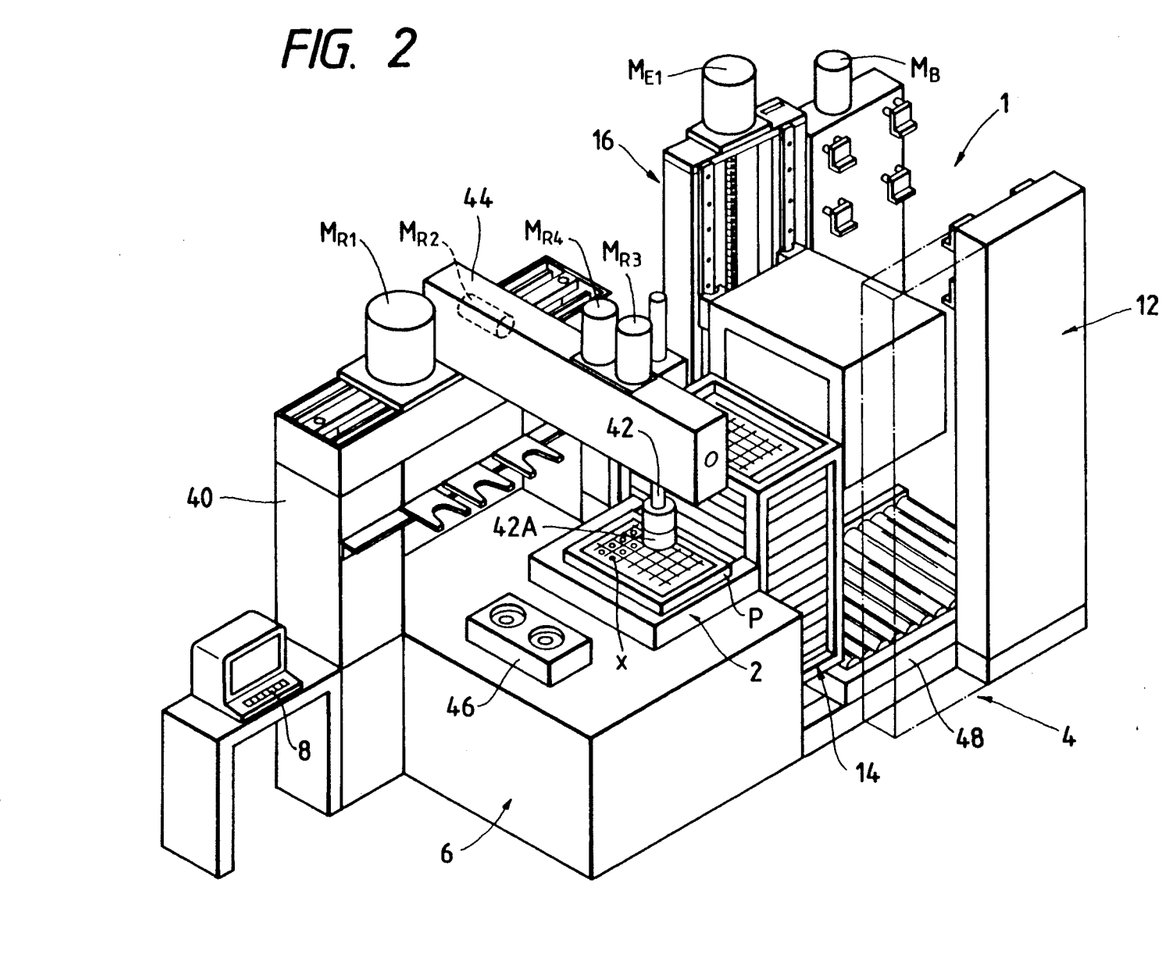
FIG. 2 is a perspective view thereof.

FIG. 1 is a schematic view of an article feeding apparatus in which the handling device of the present invention is applied, and FIG. 2 is a perspective view of said apparatus.

Said feeding apparatus is provided with an automatic assembling apparatus 2 (hereinafter called robot) for automatically assembling a predetermined product from plural parts x1, x2, x3, ..., a part supply system 4 for supplying said robot 2 with said parts automatically in the order of assembling, a control unit 6 connected to said robot 2 and said part supply system 4 for controlling these two units in order to achieve efficient assembling operation by the robot 2, and an input/output unit 8 connected to said control unit 6 for entering the assembling data by the operator.

The part supply system 4 receives various parts x1, x2, x3, ... from an unrepresented automatic warehouse, by means of plural automatic carriers 10. More specifically, the part supply system 4 is basically composed of a buffer 12 for receiving and temporarily storing the parts from the automatic carriers 10, a stocker 14 positioned next to the robot 2 and functioning as storage means for supplying said robot 2 with necessary parts according to the sequence of assembling, and an elevator 16 positioned between the buffer 12 and the stocker 14 and functioning as transfer means for supplying the stocker with the parts that have become deficient therein from the buffer 12.

Figure 3:
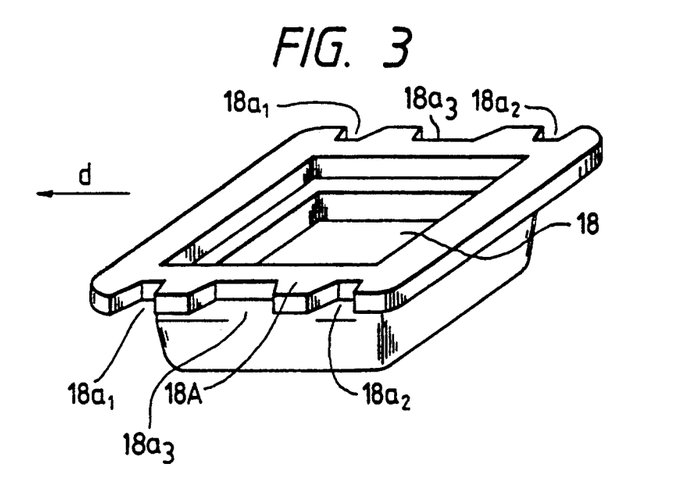
FIG. 3 is a perspective view of a pallet or a container.

The parts x1, x2, x3, ... are respectively contained in pallets p1, p2, p3, ..., and, in such pallettized state, placed on the automatic carriers 10, then temporarily stored in the buffer 12, stored in the stocker 14 by way of the elevator 16, and finally supplied to the robot 2. Each of the pallets p1, p2, p3, ... contains parts of a same type, and is composed, as shown in FIG. 3, of a main body 18 which is open at the top and contains the parts in vertically extractable manner, and an integral flange member 18A extended outwards at least in two sides parallel to the transport direction d of the pallet main body 18. As will be apparent from FIG. 3, said flange member 18A is formed, in practice, along the entire periphery of the main body 18.

Said flange member 18A is provided, as shown in FIG. 3, with first and second notches 18a1, 18a2 close to the ends, and a third notch 18a3 at the center. As will be explained later, the first and second notches 18a1, 18a2 are used for extracting the pallets p1, p2, p3, ... from the buffer 12 to the elevator 16, or from the stocker 14 to the robot 2 or the elevator 16.

Each of the first and second notches 18a1, 18a2 has a plan shape substantially of an isosceles trapezoid, with the shorter bottom constituting the bottom of the notch.

Figure 4:
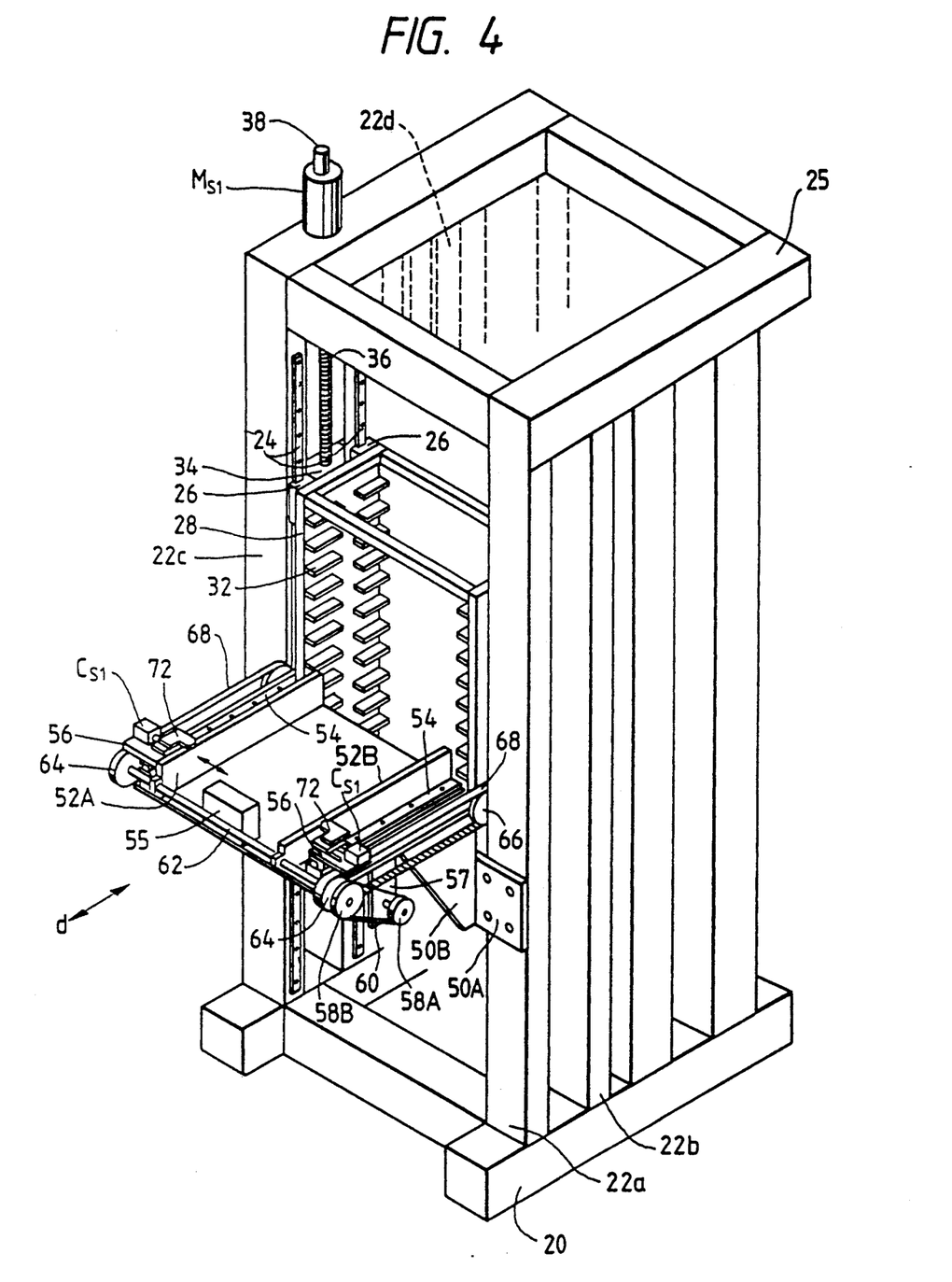
FIG. 4 is a perspective view of a stocker.

The stocker 14 is provided with a base 20 fixed on an unrepresented foundation and used commonly with the elevator 16, pillars 22a, 22b, 22c and 22d standing at the corners of said base 20, and a connecting frame 25 connecting the upper ends of said pillars. Vertically extended guide members 24 are fixed on the mutually opposed faces of the pillars 22a, 22b and 22c, 22d at the sides of elevator 16 and robot 2, and a slidable member 26 is vertically movably mounted on each guide member 24. These four slidable members 26 support the corners of a substantially rectangular elevator frame 28.

Said elevator frame 28 can hold plural pallets p to be pushed from the elevator 16 and to be extracted by an extracting device 30 for use in the assembling operation by the robot 2, in an individually extractable manner at an extraction stand-by position to be explained later. For this purpose, on the internal faces of the elevator frame 28 positioned along the transport direction d, there are provided horizontal shelf plates 32, with a vertical pitch of about 30 mm, for engaging with the flange member 18A of the pallets p.

The elevator frame 28 is integrally provided with a protruding member 34, positioned in a vertically extended space between the pillars 22c, 22d at the far side in FIG. 4.

On the connecting frame 25, connecting the upper ends of the pillars 22c, 22d at the far side, there is provided a servo motor Ms1 for vertically moving the above-mentioned elevator frame 28 along the guide members 24. The servo motor Ms1 has a vertical rotary shaft positioned rotatably between said pillars 22c, 22d and is connected to a vertical ball screw 36, which engages with said protruding member 34. Thus the rotation of the servo motor Ms1 rotates the ball screw 36, thereby elevating or lowering the elevator frame 28. The amount of vertical movement of said elevator frame 28 is selected as a multiple of the vertical pitch of the shelf plates 32, which is 30 mm.

The servo motor Ms1 is further equipped with an encoder 38 for detecting the rotational position thereof, or the vertical position of the elevator frame 28. Consequently said elevator frame can be moved to an arbitrary vertical position.

In FIGS. 1 and 2, there is shown a frame 40 for supporting the assembling robot 2; A robot hand 42; a work piece 42A; a moving rail 44 for the robot hand; a work table 46 on which the article in the pallet 18, extracted from the stocker 14 by an extraction device 30, is held by the robot hand 42 and is subjected to predetermined work; and a lifter 48 for ejecting an empty pallet 18.

Figure 5:
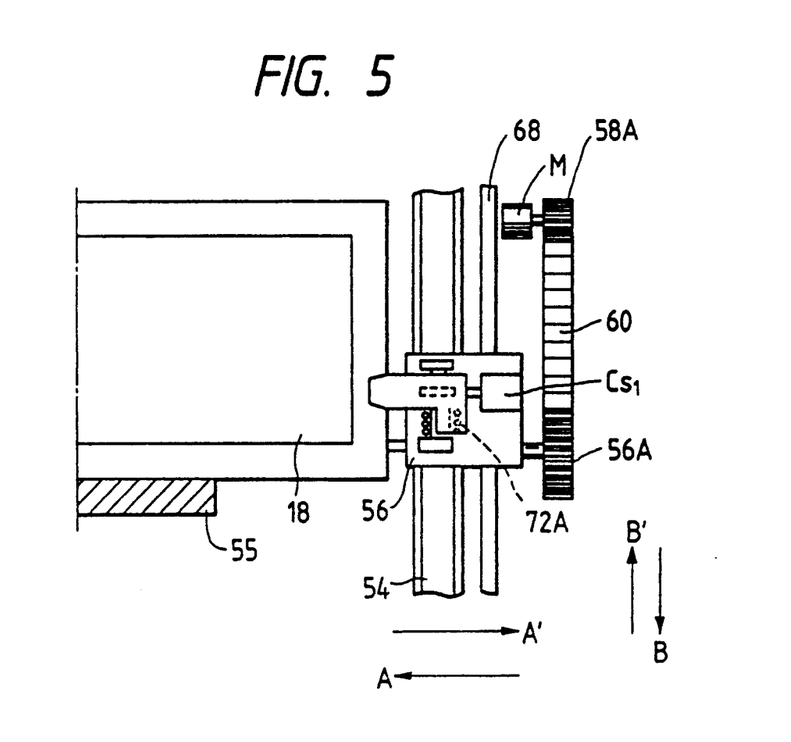
FIG. 5 is a plan view of an extraction device.
Figure 6:
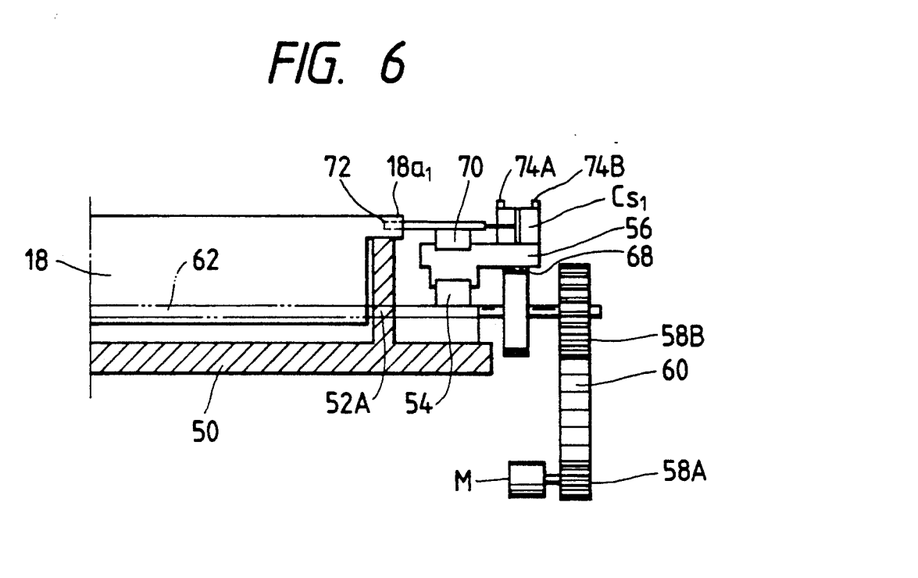
FIG. 6 is a lateral cross-sectional view thereof.

FIGS. 5 and 6 illustrate the details of the handling device 30, wherein a table 50 is mounted on the pillar 22a perpendicularly thereto by means of plate members 50A, 50B. On said table 50 there are provided pallet guide members 52A, 52B at both sides, and a stopper member 55 at the end of the pallet extracting direction. Said table 50 is further provided with engaging means for engaging with the pallets in the shelves of the stocker, and drive means for extracting the engaged pallet.

On said table 50, outside the guide members 52A, 52B, there are provided guide rails 54, engaging with the lower face of movable members 56, 56. A motor mounting plate 57, fixed under the table 50 supports a motor M the shaft of which supports a driving pulley 58A.

A driven pulley 58B, receiving the rotation of said driving pulley 58A through a driving belt 60, is fixed on a driving shaft 62 rotatably supported on the table 50. There are also provided pulleys 64, 64 mounted on said driving shaft, and pulleys 66, 66 mounted on an unrepresented shaft rotatably supported on the table 50. Endless belts 68, 68 are supported between said pulleys 64, 64 and pulleys 66, 66, and said movable members 56, 56 are fixed, at the lower faces thereof, to said endless belts 68, 68.

In the above-explained structure, the rotation of the motor on the motor mounting plate 57 is transmitted through the shaft 62 and belts 60, 68 to move the movable plates 56, 56 in reciprocating motion in a direction d, along the guide rails 54, 54 on the table 50.

On said movable plates 56, 56 there are mounted cylinders Cs1, Cs1, the piston rods of which are equipped with engaging members 72, 72.

Said engaging members 72 are shaped as hooks, for engaging with the tapered faces of the notches 18a1, 18a2 formed on the flange member 18A of the pallet 18 shown in FIG. 3.

Sensors 74A, 74B are mounted on the cylinders for detecting the piston positions, thus determining the engaging state of the engaging members and the pallet.

Springs 72A are provided for biasing the engaging members 72 in a direction B.

Figure 7:
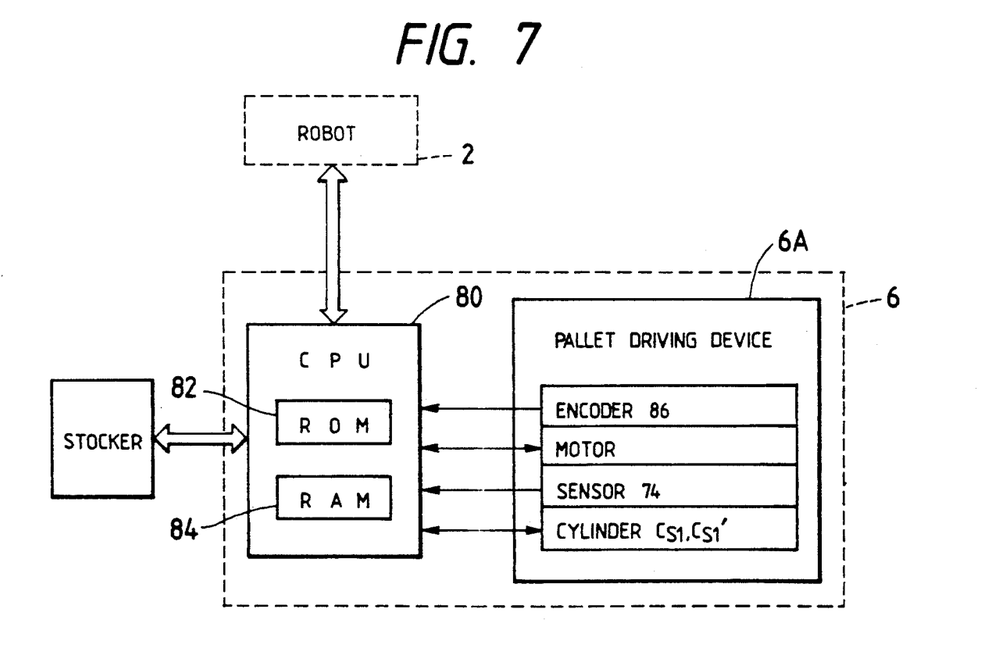
FIG. 7 is a block diagram of the control system.

FIG. 7 is a block diagram of the control system for the above-explained apparatus and robot, wherein a central processing unit (CPU) 80 is provided with a read-only memory (ROM) 82 and a random access memory (RAM) 84, and controls the function of the pallet driving device, stocker and robot.

The ROM 82 stores the control sequence for the entire apparatus, as will be explained later in relation to FIG. 8. The RAM 84 is used for storing the type and position of the pallets to be extracted, and as a work area for the control of the entire apparatus.

In the following there will be explained the function of the pallet handling device, while making reference to a flow chart shown in FIG. 8, which defines a sequence consisting of a vertical movement of stocker, extraction of a pallet stored in the stocker, extraction of parts from the pallet, returning of the pallet to the stocker, and a vertical movement again of the elevating frame of the stocker, in the following manner:

Step S1: The stocker is vertically moved in response to a signal from the robot;

Step S2: The vertical movement of the elevator frame of the stocker is stopped when a pallet required by the robot reaches the extracting position;

Step S3: The stopping of the elevator frame 28 of the stocker is detected by the encoder. The engaging members 72, 72 of the handling means of the table 50 are in a preparatory position on the table 50 during the vertical movement of the elevator frame 28;

Step S4: After a pallet to be extracted, among those stored in the elevator frame 28, reaches the position of the extracting table 50, pallet driving means 6A of the control unit 6 releases an instruction to activate the cylinders Cs1, Cs1, whereby the pistons thereof are moved to engage the engaging members 72, 72 with the engaging portions of the pallet in the shelf of the elevator frame;

Step S5: Upon completion of the engagement, the sensors 74 detect the moving strokes of the pistons and output an engagement completion signal;

Step S6: After the engagement of the engaging members 72, 72 is detected by said sensors, the motor M for driving the movable plate is activated, whereby the rotation thereof is transmitted through the driving pulley, belt and following pulleys to the movable plates 56, 56. Said movable plates move in the direction d along the guide rails 54, 54 and stop at a predetermined position on the table, where the parts can be taken out by the robot from the pallet;

Step S7: The stopping position of the pallet by the extracting device is controlled by an encoder 86 (FIG. 7) coupled with the motor M for moving the movable plates, said encoder detecting the position of said movable plates 56. In the movement of the movable plates 56 in a direction B, if the pallet is stopped very close to the stopper member 55, the pallet may collide therewith because of the eventual dimensional fluctuation in the manufacture of the pallet. Therefore the pallet is pressed against the stopper member 55 by means of the biasing force of the spring 72A.

After said encoder 86 detects that the pallet is at the stopping position, a pallet extraction completion signal is output in response to the signal of said encoder 86;

Step S8: Upon detection of completion of the pallet extraction, an instruction for picking the parts from the pallet is given to the robot;

Step S9: The pallet extracting device is stopped in the above-explained position during the part picking operation of the robot, until a pick completion signal is received from the robot;

Step S10: In response to a pick completion signal from a robot control device, indicating the completion of the part picking operation of the robot from the pallet, the movable plate driving motor is reversed to move the movable plates 56, 56, thereby returning the pallet into the stocker by means of the engaging members 72, 72;

Step S11: The return position of the movable plates 56 in the step S10 is detected by said encoder 86 for controlling the stop position of the movable plates;

Step S12: The position signal of said encoder, indicating the completion of returning of the pallet, activates the cylinders Cs1, whereby the pistons are retracted and the engaging members 72, 72 are disengaged from the pallet. The disengagement of the pallet is detected by the detection of piston position with said sensors 74, and a disengagement signal is sent to the control device. Then the feeding apparatus sends, according to a predetermined working program, a pallet containing articles to be picked up next by vertical movement to the extracting position at the table 50, and the above-explained sequence is repeated from the step S1. FIGS. 9A, 9B, 9C and 9D illustrate the states of engagement between the engaging member and the pallet.

Figure 9A:
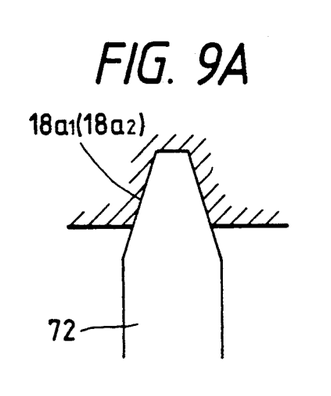
FIGS. 9A, 9B, 9C and 9D are schematic views showing the states of engagement between a pallette and an engaging member.
Figure 9B:
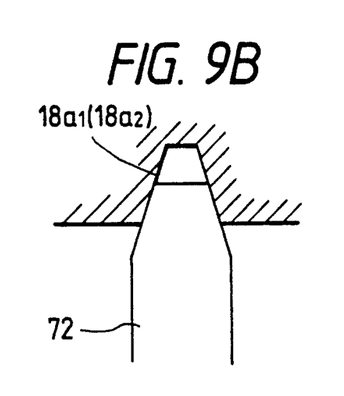
Figure 9C:
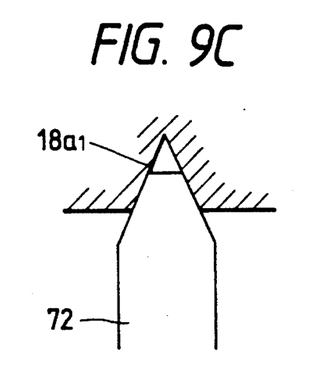
Figure 9D:
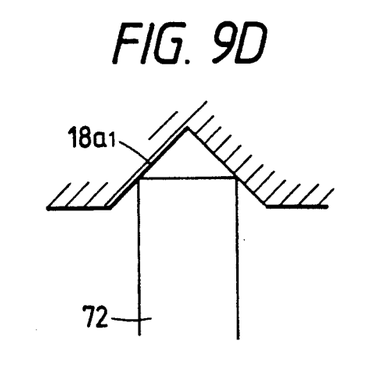

In the foregoing embodiment, the engaging members 72, 72 and the notches 18a1, 18a2 of the engaging portion are so formed that they mutually engage at the entire periphery thereof as shown in FIG. 9A, but said hooks and notches may be formed arbitrarily, even if they have a gap therebetween as shown in FIGS. 9B to 9D, as long as they mutually engage at least at two points or two lines to fix the mutual position completely and to allow movement without play.

The present invention enables exact engagement of the engaging members and the pallet by supporting the engaging members 72 and the cylinders Cs1 on the movable plates 56 rendered movable on the table 50 and by achieving the registration of the engaging portions of the pallet and the engaging members by means of movement control of said movable plates along the guide rails 54 on said table 50.

Also the engaging components including the movable plates, engaging members and cylinders, and the driving components including the pulleys and belts for driving said movable plates 56 are provided on both sides of the table 50 to support the pallet on both side faces thereof, whereby it is rendered possible to prevent the vibration of the pallet during the extracting operation and to thus avoid the positional displacement of the articles contained in the pallet. Particularly the presence of pallet guide members 52A, 52B on the table 50 allows the movement of the pallet along said guide members even if a difference is present between the pressures of the cylinders Cs1, Cs1 at left and right.

Figure 10:
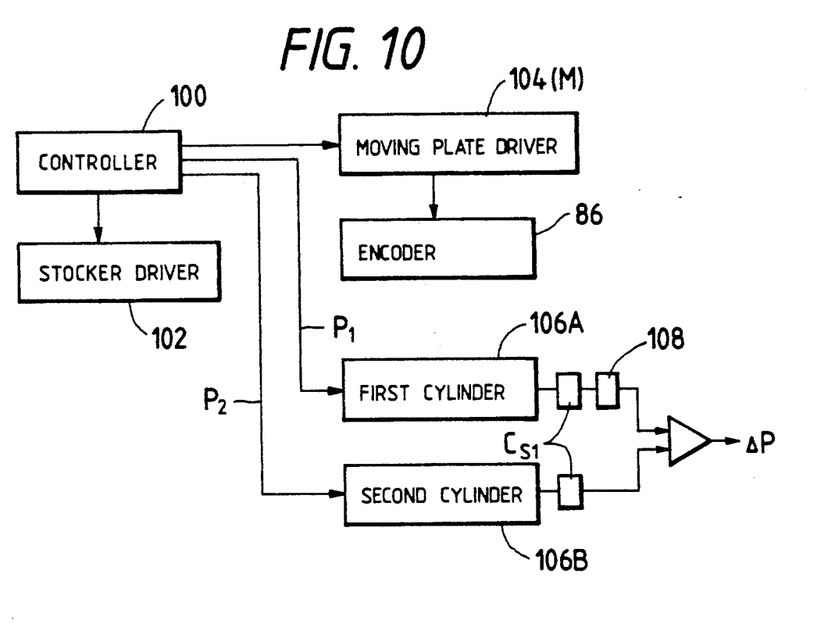
FIG. 10 is a block diagram of a control system.

FIG. 10 shows an embodiment for achieving the second object of the present invention.

Figure 11:
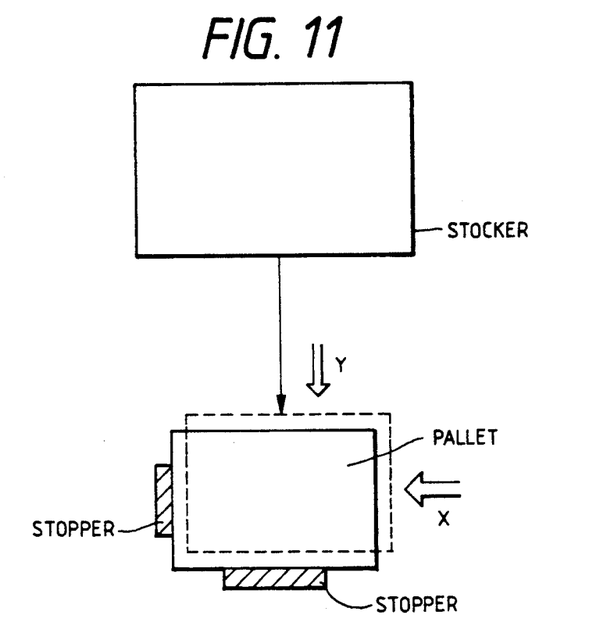
FIG. 11 is a schematic view showing the principle of pallet registration.

The pallet extracted from the stocker has to be exactly positioned, for enabling the robot to pick the parts contained in said pallet. In the conventional method, after a pallet is extracted from the stocker, it is pressed against a stopper by means of a spring or a cylinder in a direction X shown in FIG. 11. Then the pallet is pressed in a direction Y with a spring or a cylinder to a position in contact with a stopper.

In this manner the extraction of pallet in fact contained three operations of pallet extraction, positioning in the direction X and positioning in the direction Y.

The above-explained structure is unable to achieve the pallet extraction at a high speed, since it always requires the above-mentioned three steps.

Also the necessity of the means for pressing in the direction X and Y in addition to the pallet extracting means complicates the structure of the device and increases the cost thereof.

FIG. 10 shows an embodiment in which the pallet positioning is achieved by intentionally pressing the pallet to a pallet guide member by generating a difference in the pressures of said cylinders.

The mechanical structure of the present embodiment is the same as that already explained in FIGS. 1 to 9.

FIG. 10 is a block diagram of a control system to be employed in the present embodiment.

In FIG. 10, control means 100 for controlling the function of the robot and the stocker stores an operation program and a program for the robot and the stocker.

Stocker drive means 102, for driving the motor Ms1 and the encoder 38, activates said motor Ms1 according to said operation program to control the movement of the elevator frame 28, detects the position thereof by means of the encoder 38, and sends a detection signal to the control means 100 to control the stopping position of the motor Ms1.

Movable plate driving means 104 controls said motor M, detects the position of the movable plates 56 through the encoder 86 coupled with the motor M, and sends the detection signal to the control means 100 to control the stop position of the movable plates 56 on the table 50.

First and second cylinder drive means 106A, 106B for activating the cylinders Cs1, Cs1 on said table, are controlled by control signals P1, P2 for instructing the engagement of a pallet in the stocker, according to the program of the control means 100. Said first and second cylinder drive means 106A, 106B generate signals for driving said cylinders at left and right, with a pressure difference Δp therebetween.

According to the present embodiment, because of said pressure difference, the pallet is always pressed against a guide member at the engagement of the engaging members 72, 72 with the pallet, so that the pallet always moves along a guide member at the extracting operation. Thus the position of the pallet on the table can always be maintained with high precision.

Consequently the present embodiment is preferably applicable to the articles with small dimensions, or to an extracting apparatus in which the holding position of the robot hand has to be maintained with high precision.

The pressure difference between the cylinders Cs1, Cs1 may be generated by pressure decreasing means 108, which is attached to one of said cylinders.

In engaging the engaging members 72, 72 of engaging means with engaging portions $18a1$, $18a2$ as shown in the first embodiment, the width of said engaging portion has to be at least larger than the width of the engaging member in order to achieve smooth insertion. The eventual play present between the engaging portion and the engaging member hinders smooth movement at the start of operation, and may induce disengagement due to pallet vibration, if the pallet is moved at a high speed beyond a certain limit. Also, the arrangement of the articles in the pallet may be distorted.

The next embodiment achieves automatic engagement of the engaging members of the pallet extracting means with the engaging portions of the pallet, at the pallet extraction from the stocker, when a pallet to be extracted reaches the extracting position of the extracting table by the vertical movement of the elevator frame.

FIGS. 12, 13A, 13B, 13C and 13D illustrate an embodiment for achieving the above-mentioned object, wherein the same components as those in FIGS. 1 to 10 are represented by the same numbers and will not be explained further.

Figure 12:
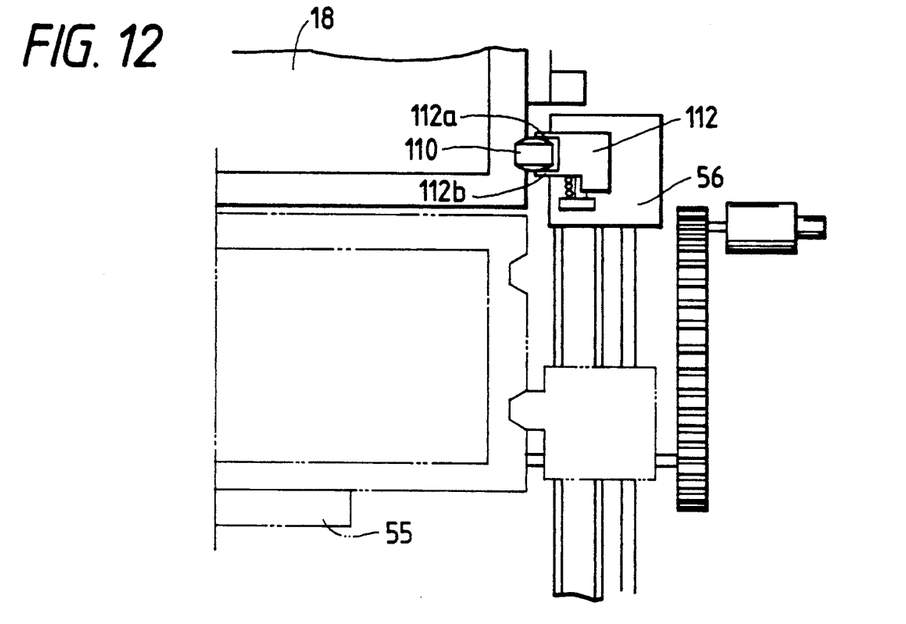
FIG. 12 is a plan view of an extracting device.

In the present embodiment, the structures of the stocker, table and components thereon are identical with those in the foregoing embodiments, except cylinders Cs1, Cs1 for moving the engaging members in directions A, A′.

A movable plate 56, fixed on the afore-mentioned belt 68, is provided with a roller support member 112 supporting an engaging roller 110. Said roller support member 112 is provided with a fork portion 112a, 112b between which an engaging roller 110 is rotatably supported by a shaft 114. The movable plate 56 reciprocates between a solid-line position and a broken-line position by driving means shown in FIG. 4. The solid-line position in FIG. 12 is so determined that the engaging rollers 110 pass through the engaging portions 18a of the pallets stored in the shelves of the elevator frame 28 at the vertical movement thereof.

The elevator frame of the stocker is vertically moved according to a work program of the robot control device, and a pallet containing the articles to be extracted is stopped at the extracting position of the table. During the vertical movement of the elevator frame, the engaging rollers pass through the engaging notches 18a of the pallets stored in said frame, and, when the desired pallet is stopped at the extracting position of the table, the engaging rollers 110 engage with the engaging notches of said pallet.

Figure 14:
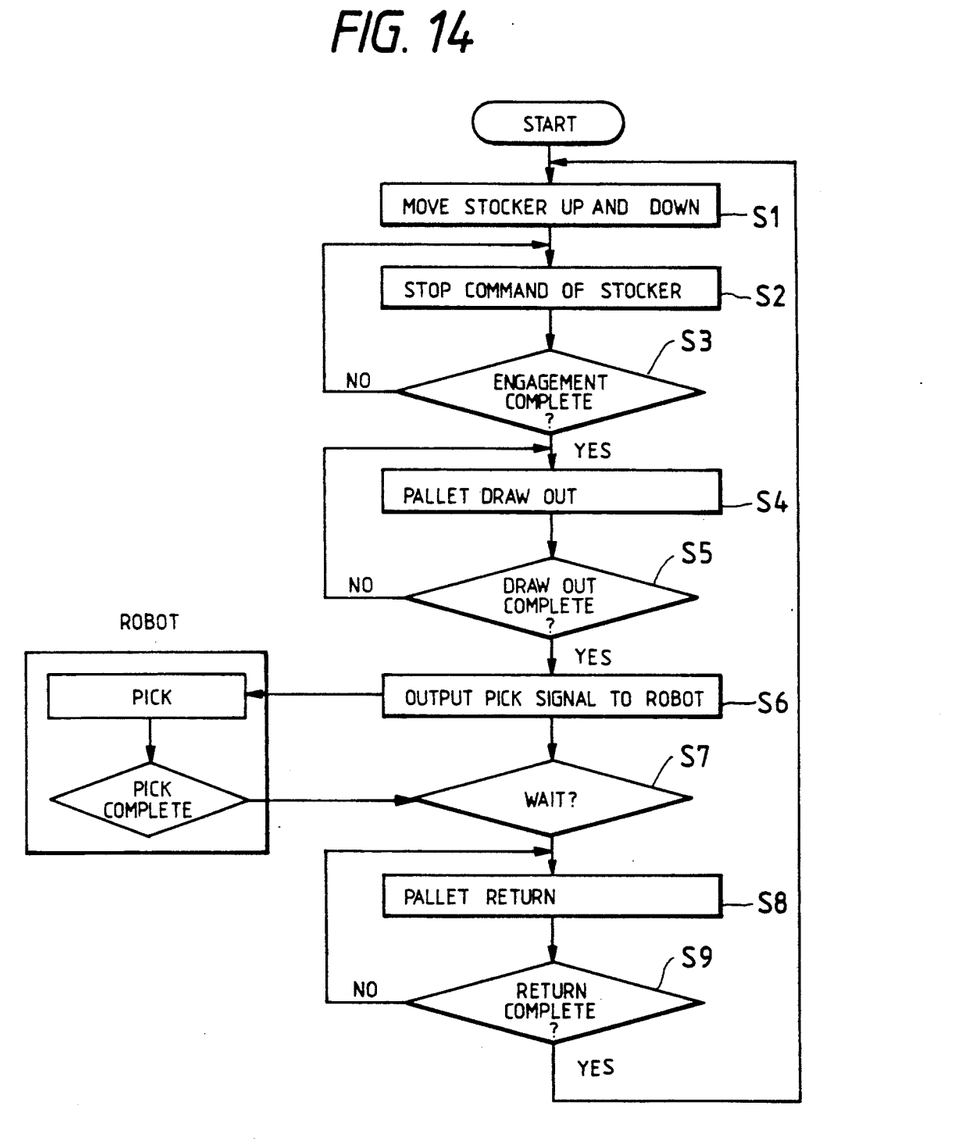
FIG. 14 is a flow chart of a control sequence.

FIG. 14 shows a flow chart of the control sequence of the extracting device of the present embodiment.

Figure 8:
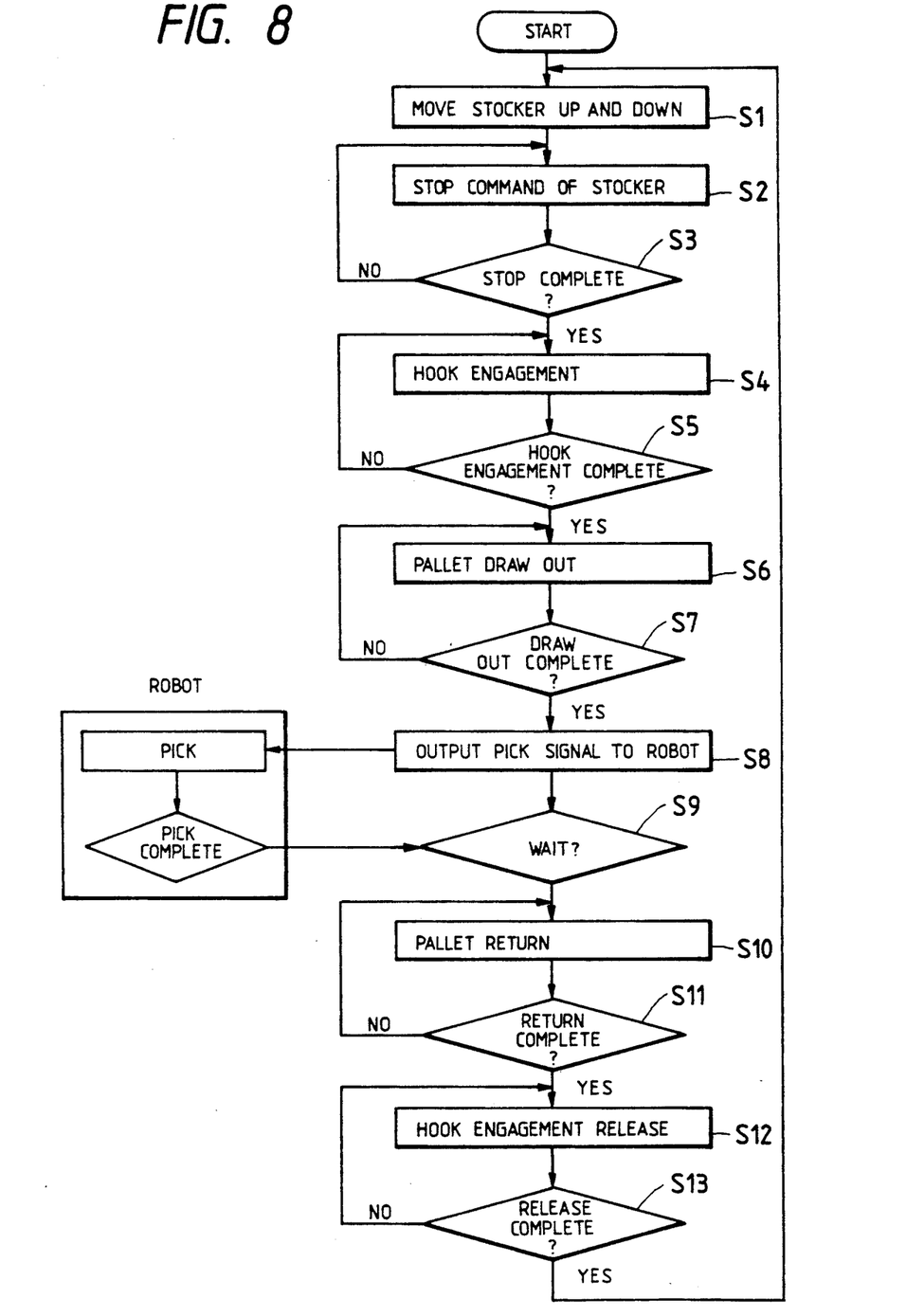
FIG. 8 is a flow chart of the control sequence.

The flow chart shown in FIG. 14 will not be explained further, as it is the same as that shown in FIG. 8, except that the steps for activating the cylinders Cs1 of the engaging means are removed.

Figure 13A:
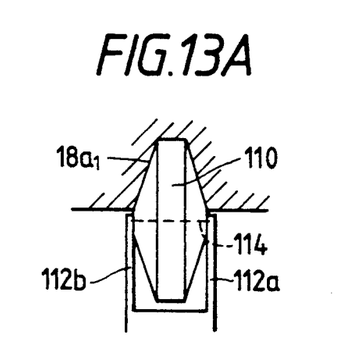
FIGS. 13A, 13B, 13C and 13D are schematic views showing the state of engagement between a pallet and an engaging member.
Figure 13B:
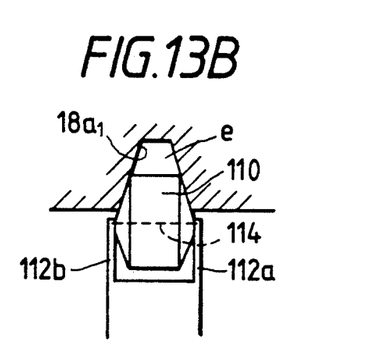
Figure 13C:
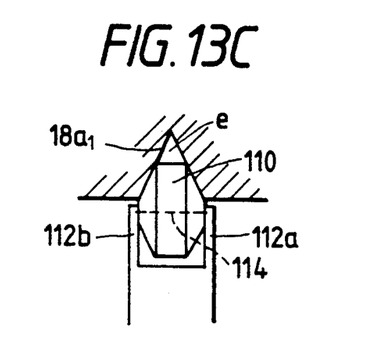
Figure 13D:
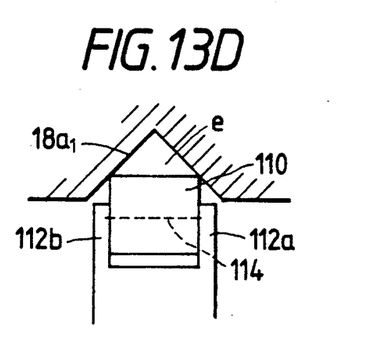

FIGS. 13B, 13C and 13D show other embodiments of the engagement between the engaging roller 110 and the engaging notch 18a of the pallet, providing a gap e therebetween or a line contact therebetween. As will be apparent from these drawings, there may be employed any structure as long as the engaging roller and the notch are mutually completely fixed by contact at least at two points or along two lines, without generating play during the movement.

The present embodiment dispenses with means for activating the engaging members, such as cylinders or solenoids, thereby simplifying the structure of the extracting device, and enabling automatic engagement of the pallet and the engaging members when the pallet is stopped by the vertical movement of the elevator frame. It is also rendered possible to shorten the period from the stopping of the elevator frame to the pallet extraction onto the table.

We claim:

1. A device for storing and extracting items, comprising:
   a stocker for storing the items, said stocker having means for elevating the items and a table for supporting the items; and
   means for transporting the items from said elevating means to said table, said transporting means being provided at both sides of said table and including:
   a moving member located on each side of said table, said moving members moving between an article loading position in said elevating means and a retracting position adjacent the sides of said table;
   driving means for driving said moving member;
   first and second engaging members disposed on said moving members;
   first and second actuation means for causing said first and second engaging members, respectively, to engage the item with an engaging force;
   means for setting the engaging force of one of said first and second actuation means greater than the other of said first and second actuation means; and
   spring members in cooperation with said first and second engaging members to exert a force against the items, with said engaging force setting means and said spring members firmly supporting the items being engaged with said engaging members for stabilizing the items in the retracting position on said table, wherein
   said first and second engaging members have rotary members with rollers having tapered faces, said rollers engaging with notched portions in the items.

2. A device according to claim 1, further including said first and second actuation means include sensor means for detecting movement of said engaging members, with the engaging state between said engaging members and the items being detected on the basis of a signal from said sensor means.

3. A device according to claim 1, wherein said moving members include detection means for detecting a position of said first and second engaging members, with said driving means being controlled by the signal of said detection means.

4. A device for storing and extracting items, comprising:
   a stocker for storing the items, said stocker having means for elevating the items, a table for supporting the items, and means for detecting an elevated position of said elevating means;
   first and second transporting means for transporting the items from said elevating means to said table, said transporting means being engageable with both sides of the items and said transporting means including;
   first and second moving members moving between an article loading position in said elevating means and a retracting position on said table;
   first and second engaging members disposed on said moving members for engaging and disengaging with the items, wherein said first and second engaging members have rotary members with rollers having tapered faces, said rollers engaging with notched portions in the items;
   first and second actuation means for effecting said engagement and disengagement of said first and second engaging members with the item; and
   means for detecting the position of said first and second moving members;
   control means for controlling said elevating means on the basis of an output signal from said elevated position detection means, for controlling said first and second moving members on the basis of the output signal from said moving member position detection means, and for outputting a control signal for driving said first and second actuation means; and
   means for setting an operation force of one of said actuation means greater than the other actuation means.

5. A device for storing and extracting items, comprising:
   a stocker for storing the items, said stocker having means for elevating the items and a table for supporting the items; and
   means for transporting the items from said elevating means to said table, said transporting means being provided at both sides of said table and including;
   a moving member located on each side of said table, said moving members moving between an article loading position in said elevating means and a retracting position on said table;
   driving means for driving said moving members;
   first and second engaging members disposed on said moving members and providing an engaging force for engaging with the items;
   first and second actuation means for actuating said first and second engaging members, respectively; and
   means for setting the engaging force of one of said engaging members greater than the other engaging member, wherein said first and second engaging members have rotary members with rollers having tapered faces, said rollers engaging with notched portions in the items.

6. A pallet driving device, comprising:
   means for storing a pallet containing items, including:
   a storing portion for storing the pallet;
   an extraction table for supporting the pallet extracted from said storing portion;
   a pallet stop member provided on an end of said extraction table;
   a guide member provided on a side of said extraction table;
   means for extracting the pallet from said storing portion onto said extraction table, said mans including first and second engaging members for engaging each side of the pallet, and first and second pushing force generating means for generating a pushing force against said first and second engaging members so as to generate a difference in pushing force between said first and second engaging members and push the pallet against said guide member; and
   means for moving said engaging members to extract the pallet from the storing portion as the pallet is being forced against said guide member by said first and second pushing force generating means.

7. A pallet driving device, comprising:
pallet storing means for storing a pallet containing items, including:
a storing portion for storing the pallet;
an extraction table for supporting the pallet extracted from said storing portion;
a pallet stop member provided on said extracted table;
means for extracting the pallet from said storing portion, said extracting means including an engaging member for engaging the pallet and for moving the pallet against said pallet stop member by applying a pushing force to the pallet in the direction toward said pallet stop member; and
means for generating a biasing force against said engaging member when said engaging member is moving the pallet toward said pallet stop member, said biasing force being generated in a direction opposite to the direction of application of the pushing force by said engaging member when the pallet contacts said pallet stop member.

* * * * *

UNITED STATES PATENT AND TRADEMARK OFFICE
CERTIFICATE OF CORRECTION

PATENT NO. : 5,203,661
DATED : April 20, 1993
INVENTOR(S) : Takeo Tanita, et al.

It is certified that error appears in the above-indentified patent and that said Letters Patent is hereby corrected as shown below:

COLUMN 2:

Line 56, "pallette" should read --pallet--.

COLUMN 4:

Line 46, "528" should read --52B--.

COLUMN 9:

Line 44, "include" should read --including.

COLUMN 10:

Line 58, "mans" should read --means--.

Signed and Sealed this

Twenty-ninth Day of March, 1994

Attest:

BRUCE LEHMAN

Attesting Officer          Commissioner of Patents and Trademarks